(12) United States Patent
Dixon et al.

(10) Patent No.: US 7,266,463 B2
(45) Date of Patent: Sep. 4, 2007

(54) SIGNAL IDENTIFICATION METHOD AND APPARATUS FOR ANALOGUE ELECTRICAL SYSTEMS

(75) Inventors: Robert Christopher Dixon, Austin, TX (US); John Wayne Hartfiel, Austin, TX (US); Hein Minh Le, Cedar Park, TX (US); Tung Nguyen Pham, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 163 days.

(21) Appl. No.: 11/126,120

(22) Filed: May 10, 2005

(65) Prior Publication Data

US 2006/0259161 A1 Nov. 16, 2006

(51) Int. Cl.
G01R 19/00 (2006.01)
(52) U.S. Cl. .......................... 702/64; 375/220
(58) Field of Classification Search ................ 702/57, 702/64, 118, 120, 183, 185, 189; 375/220; 370/212; 700/25
See application file for complete search history.

(56) References Cited

U.S. PATENT DOCUMENTS

| | | | | |
|---|---|---|---|---|
| 4,379,332 A | * | 4/1983 | Busser et al. ............... | 701/105 |
| 4,835,522 A | * | 5/1989 | Andrejasich et al. ....... | 340/521 |
| 5,007,042 A | * | 4/1991 | Santi ........................... | 370/212 |
| 5,491,418 A | * | 2/1996 | Alfaro et al. ............... | 324/402 |
| 5,737,364 A | * | 4/1998 | Cohen et al. ............... | 375/220 |
| 6,321,282 B1 | * | 11/2001 | Horowitz et al. ........... | 710/104 |
| 6,366,118 B2 | * | 4/2002 | Oh et al. ..................... | 326/38 |

* cited by examiner

Primary Examiner—Carol S. W. Tsai
Assistant Examiner—Mohamed Charioui
(74) Attorney, Agent, or Firm—Francis Lammes; Stephen J. Walder, Jr.; Diana R. Gerhardt

(57) ABSTRACT

An apparatus, a method, and a computer program product are provided for identifying signals in analogue electrical systems. The ID select signals that control the timing of this signal identification circuit comprise sequential numbers that count up and identify a corresponding signal. The signals to be identified are located on a group of input/output (I/O) pins. One multiplexer (first) selects a specific I/O pin in response to the ID select signals. An isolated voltage source is connected to this multiplexer and provides the selected signal to another multiplexer (second). The second multiplexer switches from this isolated voltage source to ground potential in response to the ID select signals. The isolated voltage source floats at the DC level of the selected I/O driver pin. Therefore, by connecting to the selected signal's I/O pin and the output of the second multiplexer, the selected signal can be identified and then probed.

13 Claims, 5 Drawing Sheets

SIGNAL IDENTIFICATION METHOD AND APPARATUS FOR ANALOGUE ELECTRICAL SYSTEMS

FIELD OF THE INVENTION

The present invention relates generally to a method of signal identification, and more particularly, to a method of signal identification for analogue electrical systems.

DESCRIPTION OF THE RELATED ART

In debugging and monitoring digital systems, the complexity of probing increases as the physical dimensions decrease and packaging technologies become more miniature. Probing always creates some uncertainty as to what signal is being probed by the test equipment because the testing equipment must be attached to small, precise connections. This is especially difficult if the probing process is manual. Furthermore, with the complexity of digital systems, it is difficult to determine if the desired signals are being probed. This process requires that the testing equipment is connected correctly. The analysis and measurements of the desired signals are inaccurate unless the complex testing equipment is connected to the complex digital system correctly. This is due to the fact that the testing equipment may be analyzing the wrong signal or no signal at all.

Probing in complex digital systems is difficult for all types of test equipment. Dedicated test equipment such as logic analyzers, oscilloscopes and counters, and hand held test equipment such as digital probes and multi-meters, experience the problems described above. A method and/or apparatus that can allow testing equipment to accurately identify specific signals within a complex digital system would alleviate many of these problems. This would allow the testing equipment to identify the desired signal and subsequently, probe the correct signal. Ultimately, this would ensure that there is a good connection and that the correct signal is being accurately analyzed or measured.

SUMMARY

The present invention provides an apparatus, a method, and a computer program product for identifying signals in analogue electrical systems. This invention can be implemented to identify input signals, output signals, and bi-directional signals. Probing in complex digital systems is difficult, especially as physical dimensions decrease and packaging technologies become more miniature. By identifying the desired signal before probing it, the testing equipment can operate more efficiently and accurately. This invention enables the testing equipment to provide a good connection, ensures that the correct signals are being analyzed, and permits the testing equipment to "self-configure" based upon the type of analysis desired.

The ID select signals that control the timing of this signal identification circuit comprise sequential numbers that count up and identify a corresponding signal. The signals to be identified are located on a group of input/output (I/O) pins. One multiplexer (first) selects a specific I/O pin in response to the ID select signals. An isolated voltage source is connected to this multiplexer and provides the selected signal to another multiplexer (second). The second multiplexer switches from this isolated voltage source to ground potential in response to the ID select signals. The isolated voltage source floats at the DC level of the selected I/O driver pin. Therefore, the selected signal can be identified and probed by connecting to the correct I/O pin and the second multiplexer. The small identification signal impressed on the pin is not visible on the path used to convey signals in the analogue electrical circuits.

For an example, the number "1" from the ID select signals indicates that the first multiplexer selects I/O pin 0. At this time the second multiplexer selects the isolated voltage source. The I/O pin 0 and the output of the second multiplexer identify the signal on the I/O pin 0. When the ID select signals count to "2," the second multiplexer switches to ground and the actual signal on the I/O pin 0 can be probed. When the ID select signal counts to "3" the first multiplexer switches to I/O pin 1 and the second multiplexer switches back to the isolated voltage source. This process enables the testing equipment to identify the desired signal and then probe it.

BRIEF DESCRIPTION OF THE DRAWINGS

For a more complete understanding of the present invention and the advantages thereof, reference is now made to the following descriptions taken in conjunction with the accompanying drawings, in which.

DETAILED DESCRIPTION

In the following discussion, numerous specific details are set forth to provide a thorough understanding of the present invention. However, those skilled in the art will appreciate that the present invention may be practiced without such specific details. In other instances, well-known elements have been illustrated in schematic or block diagram form in order not to obscure the present invention in unnecessary detail. Additionally, for the most part, details concerning network communications, electro-magnetic signaling techniques, and the like, have been omitted inasmuch as such details are not considered necessary to obtain a complete understanding of the present invention, and are considered to be within the understanding of persons of ordinary skill in the relevant art.

The present invention solves many of the problems involved with debugging and monitoring complex and miniature digital systems. First, probing typically creates some uncertainty that the probing connection is correctly connected. The ability to identify the desired signal allows the testing device to ensure that the connection is correct. Second, when a certain analysis is desired, this modified testing method ensures that the actual sets of signals required for the analysis are present. Furthermore, this signal identification mechanism enables the testing equipment to "self-configure." The testing equipment is able to "self-configure" due to the knowledge of the type of analysis desired and the knowledge of which channels are connected to which signals. This signal identification mechanism can be applied to input signals, output signals, or bi-directional signals.

Figure 1:
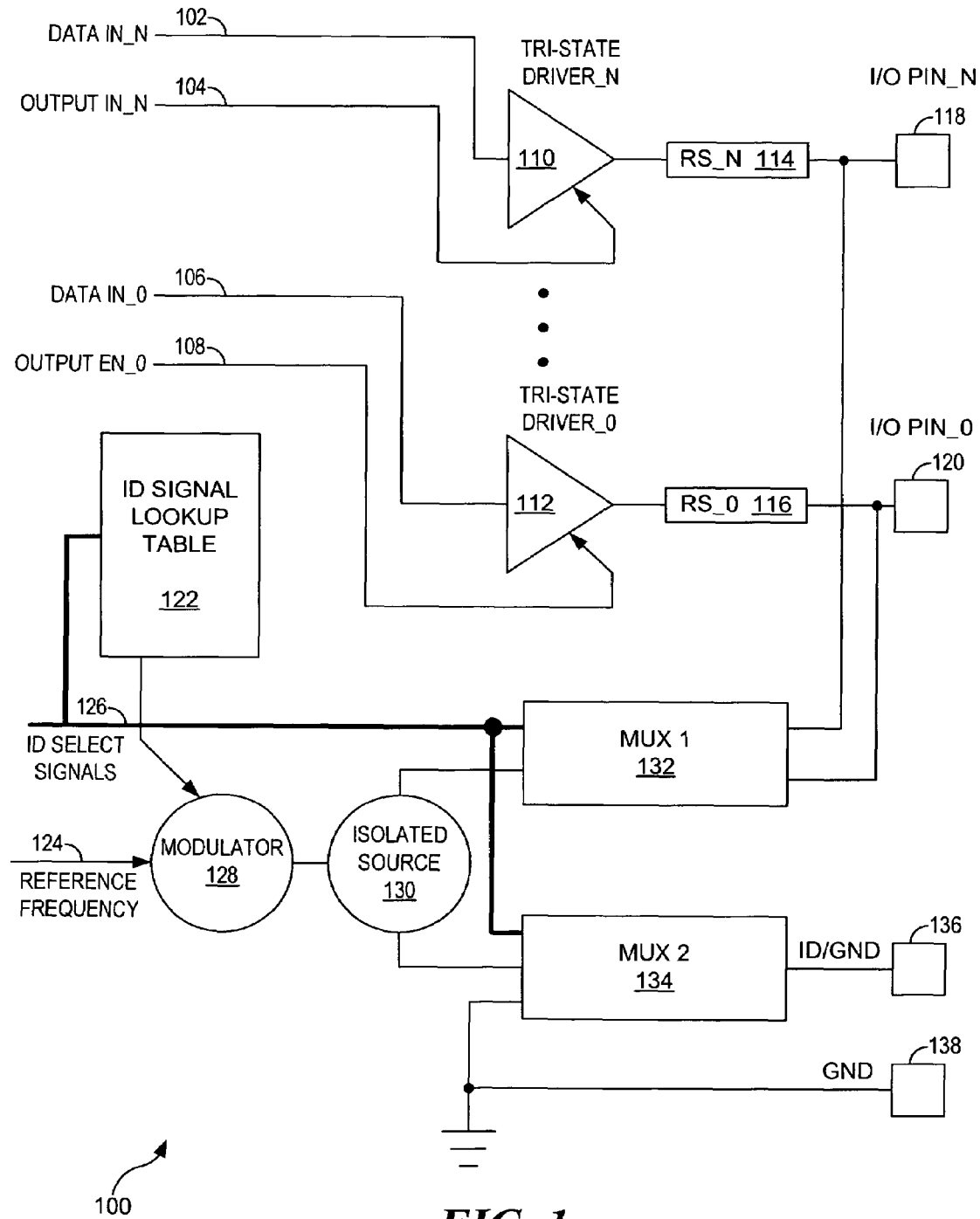
FIG. 1 is a block diagram of a modified signal identification circuit.

FIG. 1 depicts a block diagram of a modified signal identification circuit 100. Data in_n 102 and data in_0 106 are the input data signals for tri-state driver_n 110 and tri-state driver_0 112, respectively. Output in_n 104 and output en_0 108 are the signals that enable the output of driver 110 and driver 112, respectively. Rs_n 114 represents the source impedance of driver 110, and rs_0 116 represents the source impedance of driver 112. I/O pin_n 118 is the output pin for the driver 110, and I/O pin_0 120 is the output pin for the driver 112. The I/O pins, 118 and 120, can be input or output pins. The number of these drivers in the integrated circuit is unimportant because this signal identification mechanism can handle numerous driver or receiver circuits. Furthermore, these drivers can be replaced by receivers or driver/receiver circuits.

The ID select signals 126 determine which data pin 118 or 120 has been selected and is identified by MUX 1 132. Signals 126 connect to two multiplexers, MUX 1 132 and MUX 2 134. MUX 1 132 selects the correct I/O pin 118 or 120 in response to the ID select signals 126. Analogue multiplexer, MUX 2 134 switches between the selected I/O pin's identification signal and ground based upon the ID select signals 126. When MUX 2 134 outputs ground, it is in GND mode, and when it outputs the AC identification signal, it is in ID mode. MUX 2 134 also connects to the GND pin 138. The output of MUX 2 134 is the ID/GND pin 136. The ID/GND pin 136 alternates between the AC identification signal and ground. The isolated voltage source 130 that powers these multiplexers is not referenced to ground, but floats at the DC level of the selected I/O driver pin 118 or 120.

For this embodiment, ID select signals 126 are sequential numbers that count up and identify the corresponding I/O pin 118 or 120. ID select signals 126 are an input into the ID signal lookup table 122, which may be a read-only memory (ROM) device that contains the information (described herein) about each signal. Table 122 enables the signal identification circuit 100 to provide the signal name and/or the specifics of the signal to the testing equipment (not shown). For instance, the lookup table 122 enables the ID select signals 126 to inform the testing equipment of the signal name and the voltage range for the signal (described herein). Lookup table 122 connects to modulator 128, which controls isolated voltage source 130 in response to the selected signal. A reference frequency 124 allows modulator 128 and isolated voltage source 130 to run on the same timing cycles as the ID select signals 126.

This apparatus 100 impresses the AC identification signal on the pin 118 or 120 that carries the signal. The small AC identification signal impressed on the pin 118 or 120 is not visible on the path used to convey signals between drivers 110 or 112 and receivers (not shown). The apparatus 100 impresses the AC identification signal between the I/O pin 118 or 120 being identified by MUX 1 132 and ID/GND pin 136, whereas the actual signal exists on the I/O pin 118 or 120 and ground 138. MUX 2 134 shares the ID/GND pin 136 for all of the I/O pins being identified for a given apparatus 100.

As previously mentioned, isolated voltage source 130 floats and is not referenced to ground. The line of the voltage source 130 that connects to MUX 2 134 is maintained at DC ground potential. In turn, ID/GND output 136 is always at ground potential independent of the DC level on the selected I/O pin (e.g. 118 or 120). The isolation of the pin being measured and the ID/GND signal 136 is achieved via a capacitive isolator (described in more detail in FIG. 2). Without this isolation, ID/GND signal 136 affects the latch DC voltage each time MUX 2 134 switches between GND mode and ID mode.

Compatible test equipment (not shown) connects to the ID/GND pin 136 using a ground lead and to the appropriate I/O pin 118 or 120 using a channel lead. First, the test equipment must find the signal identification sequence, which is provided by the ID select signals 126. This is called signal identification mode. Once the identification sequence is detected, the test equipment triggers a timer and internally changes the sampling from identification mode to data acquisition mode. In data acquisition mode, the test equipment measures and samples data from the signal.

Figure 2:
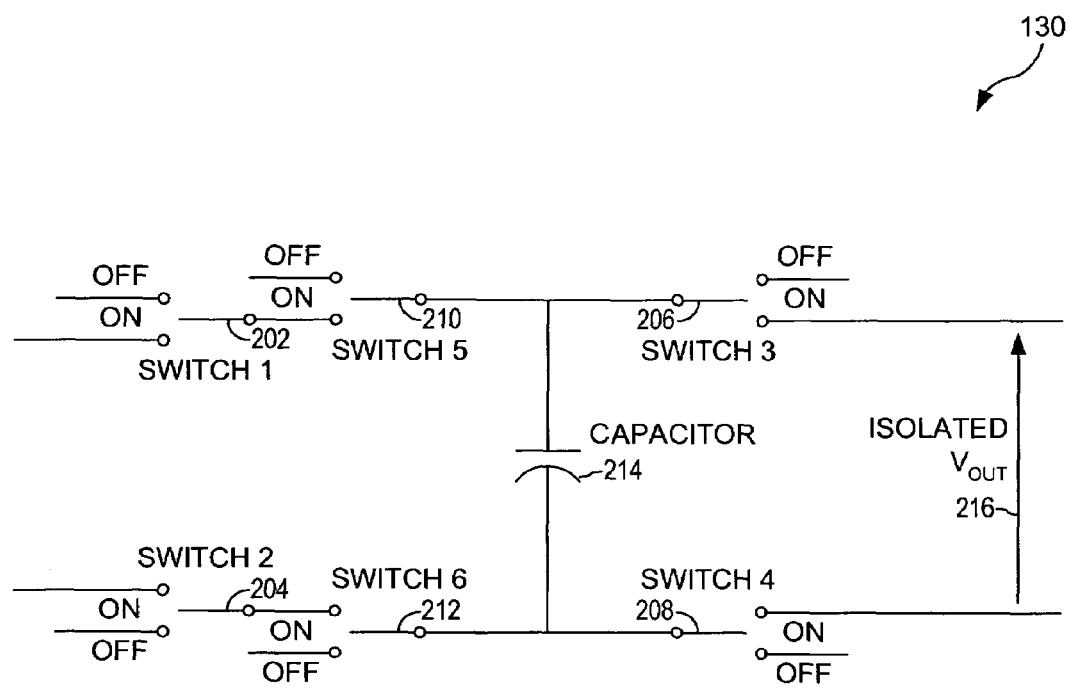
FIG. 2 is a schematic diagram of an isolated voltage source in the signal identification circuit.

FIG. 2 depicts a schematic diagram of an isolated voltage source 130 in the signal identification circuit 100 (see FIG. 1). As previously stated, source 130 is floating and is not referenced to ground. Capacitor 214 is an energy storage element. Capacitor 214 along with six switches (switch 1 202, switch 2 204, switch 3 206, switch 4 208, switch 5 210, and switch 6 212) make up voltage source. All of the switches are non-overlapping, which means that they have a break before make characteristic. The isolated Vout 216 is generated by sequencing the 6 switches to generate an alternating voltage on capacitor 214, and then connecting capacitor 214 to the signal net to be identified. Vout 216 voltage is an input to MUX 1 132 and MUX 2 134. FIG. 2 is an example of a switch capacitor isolated voltage source. Similar results can be achieved with an optically isolated voltage source or a transformer isolated voltage source.

In FIG. 2, in the "on" position, all of the switches would be connected to the connections labeled "on," which are voltage controlled by the modulator 128 in FIG. 1. In the off position all of the switches would be connected to the connection labeled "off" and be isolated or floating. A typical sequence begins with switch 1 202 and switch 2 204 "on" and switch 3 206 and switch 4 208 "off." Switch 5 210 and switch 6 212 are also "on." In this sequence, modulator 128 charges the capacitor 214 with a positive polarity. Next, switch 5 210 and switch 6 212 change to the "off" connection. Simultaneously, switch 3 206 and switch 4 208 turn "on" and switch 1 202 and switch 2 204 turn "off." This connects the voltage source (capacitor 214) to the load (isolated Vout 216). Then switch 3 206 and switch 4 208 turn "off," and switch 1 202, switch 2 204, switch 5 210, and switch 6 212 turn "on." Modulator 128 charges capacitor 214 with a negative polarity. Next, switch 1 202, switch 2 204, switch 5 210 and switch 6 212 turn "off" and switch 3 206 and switch 4 208 turn "on" again to connect capacitor 214 to Vout 216. This sequence repeats itself to produce an AC signal to the load and power the analogue MUX 2 134 for identifying the selected signal. In another implementation, capacitor 214 may be an external component.

Figure 3:
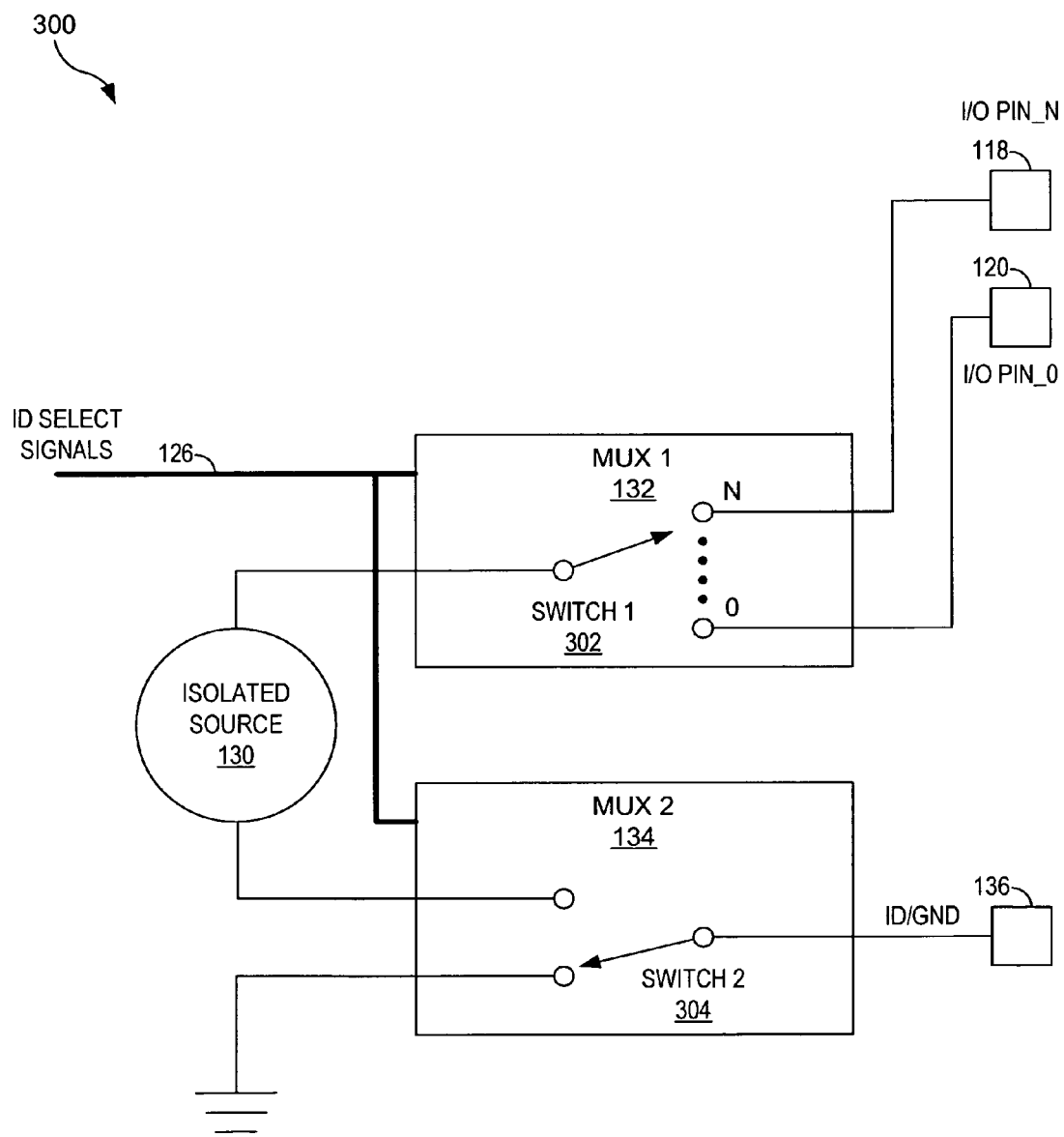
FIG. 3 is a block diagram of the analogue multiplexers in the signal identification circuit.

FIG. 3 depicts a block diagram of the analogue multiplexers 300 in the signal identification circuit 100. MUX 1 132 consists of a switch, switch 1 302, that selects the correct I/O pin. In FIG. 3, the two I/O pins are I/O pin_n 118 and I/O pin_0 120. As previously stated, there can be a large number of I/O pins to be identified. ID select signals 126 are another input to MUX 1 132 that tell MUX 1 132 which I/O pin 118 or 120 to select. As the ID select signals 126 count up, the switch 302 moves from one I/O pin to the next. Switch 1 302 connects to isolated source 130 to provide the selected I/O pin's signal. Switch 1 302 enables isolated source 130 to float at the DC level of the selected I/O driver pin.

MUX 2 134 consists of switch 2 304. This switch 304 alternates between isolated source 130 and ground. Switch

2 304 connects to ID/GND pin 136. ID select signals 126 are an input to MUX 2 134. ID select signals 126 tell MUX 2 134 whether to select isolated source 130 or ground. For example, when ID select signals 126 tell MUX 1 132 to select I/O pin_0 120, switch 1 302 connects to I/O pin 120. At this time the ID select signals 126 tell MUX 2 134 to connect to the isolated source 130. This is ID mode and the testing equipment can identify the signal by connecting to the correct I/O pin 120 and the ID/GND pin 136. After a small delay, ID select signals 126 tell MUX 2 134 to switch to ground. Accordingly, switch 2 304 connects to ground. This is GND mode and the selected signal can be probed and measured as reference to ground.

Figure 4:
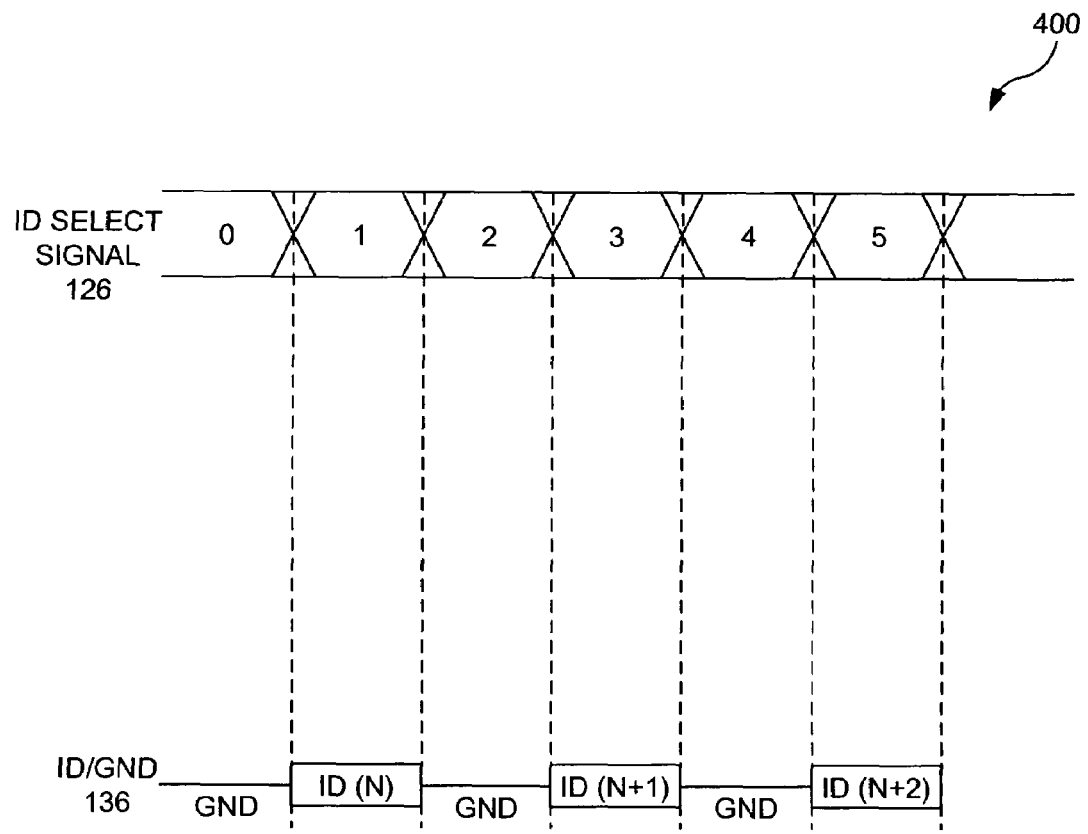
FIG. 4 is a timing diagram illustrating the analogue multiplexer ID/GND output signal in reference to the ID select signals.

FIG. 4 depicts a timing diagram 400 illustrating the analogue multiplexer ID/GND output signal in reference to the ID select signals. For this embodiment, ID select signals 126 is a counter value. As shown in FIG. 4, ID select signals 126 increment from 0 to 5. The assigned values of the ID/GND pin 136 are stored in ID signal lookup table 122. At 0 the ID/GND output 136 is at ground. At 1 the ID/GND output 136 goes to a specific AC identification signal, N. At 2 the ID/GND output 136 returns to ground. At 3 the ID/GND output goes to a different AC identification signal, N+1. At 4 the ID/GND output goes back to ground. At 5 the ID/GND output goes to a different AC identification signal, N+2.

As an example, N denotes the AC identification signal for I/O pin 0. When the ID select signals 126 hit 1, then the ID/GND pin 136 connects to the corresponding AC identification signal for I/O pin 0 120. When the ID select signals 126 hit 3, then the ID/GND pin 136 is the corresponding AC identification signal for I/O pin 1 (not shown). When ID select signals 126 hit 5, then the ID/GND pin 136 is the corresponding AC identification signal for I/O pin 2 (not shown). When MUX 2 134 outputs a specific AC identification signal, the testing equipment can identify the signal that corresponds to the AC identification signal. Once the equipment has identified the signal, MUX 2 134 output of ground allows the equipment to measure and sample the actual data. Accordingly, MUX 1 132 connects to I/O pin 0 120 when ID select signals 126 hit "1." Therefore, the testing equipment probes the signal on I/O pin 0 120 when ID select signals 126 hits "2." When ID select signals 126 hit "3," MUX 1 132 connects to I/O pin 1 (not shown).

Figure 5:
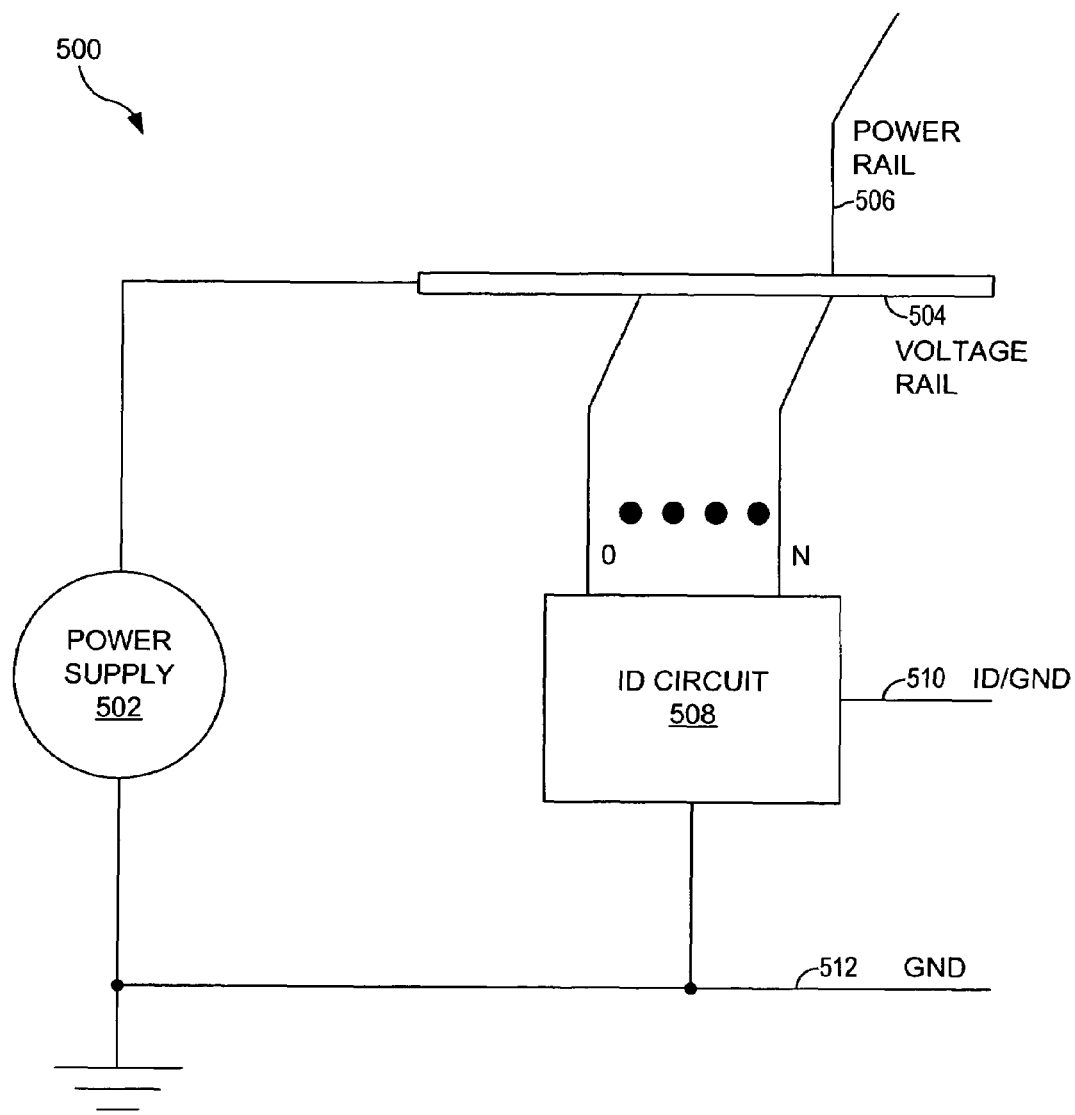
FIG. 5 is a block diagram of a signal identification circuit connected to a power supply.

FIG. 5 generally designates a block diagram of signal identification circuit 508 connected to power supply 502. This configuration is used to identify power supply outputs. ID circuit 508 represents an embodiment of signal identification circuit 100 in FIG. 1. ID/GND line 510 is the same ID/GND line 136 in FIG. 1. GND line 512 connects to the power supply 502. This power supply 502 has a very low source impedance, typically in the milliohm range. Power supply 502 provides a voltage rail 504 with respect to GND 512. Normal multimeters would measure the voltage between GND 512 and the voltage rail 504. The present invention allows a compatible multimeter to make a measurement by measuring voltage rail 504 with respect to ID/GND signal 510. Power rail 506 depicts the actual signal to be probed. One ID circuit 508 can enable this type of identification probing for a large number of input signals, output signals, or bi-directional signals.

ID/GND point 510 may be a test point or a suitably-identified copper trace of a printed circuit board. The compatible multimeter connects to the signal identification circuit 500 with the ground lead for the channel to ID/GND pin 510, and with the channel input to voltage rail 504. The multimeter senses the ID synchronization pattern and the corresponding identification information relating to the signal probed. This information is stored in the lookup table 122 of FIG. 1. Then at the appropriate time, when the analogue multiplexer has switched to output GND on ID/GND pin 510, the testing equipment makes the actual measurement and displays the voltage. The corresponding identification information can also provide the expected voltage. Therefore, not only the actual voltage can be read, but the expected voltage can be displayed.

There are many other novel features that can be implemented using the present invention. The signal identification information can contain a range of safe voltages for the selected signal. This allows the testing equipment to show the actual voltage and whether the actual voltage is within the desired range. If the voltage of the select signal is out of range (too high or too low), then the equipment produces a warning message. Furthermore, any other signal specifics that can be used by another type of testing equipment can be provided with the signal identification information. As previously described, the present invention also allows compatible testing equipment to "self-configure" for the selected signal, given the type of analysis desired and the knowledge of which probes are connected to which signals.

The testing equipment for this invention can provide additional safety features. This apparatus 100 ensures a positive indication of a circuit connection. Therefore, if the selected signal is supposed to show 100 volts and there is corrosion, the testing device shows that the device is properly connected and the signal is supposed to show 100 volts. Alternatively, if there is no signal of a positive connection and the reading is 0 volts, then the operator should know that there is not a connection. Previously, if the operator thinks that the connection is made and 0 volts is the output then he could get electrocuted because he believes there is no voltage for the signal. This is why simple probing without signal identification may not be adequate due to corrosion or other issues.

The ability to identify and test a desired signal without affecting the actual signals in the integrated circuits provides a vast improvement over prior art debugging and monitoring methods. The present invention enhances the ability to accurately and safely probe complex digital systems. Furthermore, the ability to identify select signals and specific information about these signals greatly enhances the capabilities of the corresponding testing equipment.

It is understood that the present invention can take many forms and embodiments. Accordingly, several variations of the present design may be made without departing from the scope of the invention. The capabilities outlined herein allow for the possibility of a variety of programming models. This disclosure should not be read as preferring any particular programming model, but is instead directed to the underlying concepts on which these programming models can be built.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Many such variations and modifications may be considered desirable by those skilled in the art based upon a review of the foregoing description of preferred embodiments. Accordingly, it is appropriate that the appended claims be construed broadly and in a manner consistent with the scope of the invention.

The invention claimed is:

1. An apparatus for identifying signals in analogue electrical systems by utilizing a plurality of identification (ID) select signals comprising:
    a plurality of input/output (I/O) pins;
    at least one first multiplexer which interfaces with at least one isolated voltage source, wherein the at least one first multiplexer is at least configured to select a corresponding I/O pin of the plurality of I/O pins in response to a selected ID select signal from the plurality of ID select signals;
    and wherein the at least one voltage source is at least configured to produce an alternating current (AC) signal in response to the selected ID select signal; and
    at least one second multiplexer which interfaces with the at least one voltage source, wherein the at least one second multiplexer is at least configured to select the at least one isolated voltage source and ground in response to the selected ID select signal.

2. The apparatus of claim 1, wherein the apparatus further comprises:
    at least one ID signal lookup table that is at least configured to store information about the plurality of signals; and
    at least one modulator that interfaces the at least one ID signal lookup table and the at least one isolated voltage source.

3. The apparatus of claim 2, wherein the at least one ID signal lookup table is at least configured to receive the plurality of ID select signals and transmit information about the plurality of ID select signals.

4. The apparatus of claim 3, wherein the at least one modulator is at least configured to control the voltage of the at least one isolated voltage source in response to the output of the at least one ID signal lookup table.

5. The apparatus of claim 1, wherein the plurality of ID select signals comprise sequential numbers that count up and identify the corresponding I/O pin of the plurality of I/O pins.

6. The apparatus of claim 1, wherein the plurality of ID select signals are input signals, output signals, or bi-directional signals.

7. The apparatus of claim 1, wherein the at least one first multiplexer further comprises an internal switch that connects the at least one isolated voltage source to the corresponding I/O pin of the plurality of I/O pins in response to the selected ID select signal in the plurality of ID select signals.

8. The apparatus of claim 1, wherein the at least one second multiplexer further comprises an internal switch that connects an ID/GND pin to the at least one isolated voltage source or ground in response to the selected ID select signal in the plurality of ID select signals.

9. The apparatus of claim 1, wherein the at least one isolated voltage source is not referenced to ground and floats at the voltage level of the corresponding I/O pin of the plurality of I/O pins in response to the selected ID select signal in the plurality of ID select signals.

10. A method for identifying signals in analogue electrical systems by utilizing a plurality of ID select signals comprising:
    generating, using an ID signal lookup table, a selected ID select signal from the plurality of ID select signals;
    selecting, using a first multiplexer, one of a plurality of I/O pins that corresponds to the selected ID select signal in response to receiving the selected ID select signal in the first multiplexer;
    producing, using an isolated voltage source, an AC signal from a selected signal of a plurality of signals in response to receiving the selected ID select signal;
    selecting, using a second multiplexer, the AC signal and ground potential in response to receiving the selected ID select signal in the second multiplexer;
    probing, using test equipment, the plurality of I/O pins to identify the selected signal on one of the plurality of I/O pins; and
    displaying the selected signal.

11. The method of claim 10, wherein the generating step further comprises generating the ID select signals such that the generated ID select signals contain sequential numbers that count up and identify a corresponding I/O pin of the plurality of I/O pins.

12. The method of claim 10, wherein the producing step further comprises utilizing an isolated voltage source to produce the AC signal.

13. The method of claim 10, wherein the selecting step further comprises selecting the AC signal to identify the selected ID select signal of the plurality of ID select signals and selecting ground potential to probe the selected ID select signal of the plurality of ID select signals.

* * * * *